US011482852B2

United States Patent
Djelassi-Tscheck et al.

(10) Patent No.: US 11,482,852 B2
(45) Date of Patent: Oct. 25, 2022

(54) SEMICONDUCTOR SWITCH CIRCUIT

(71) Applicant: Infineon Technologies AG, Neubiberg (DE)

(72) Inventors: Christian Djelassi-Tscheck, Villach (AT); Ulisse Lorenzo Lillo, Villach (AT); Michael Luschin, Krumpendorf (AT); Mario Tripolt, Ferndorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/173,772

(22) Filed: Feb. 11, 2021

(65) Prior Publication Data

US 2021/0273634 A1    Sep. 2, 2021

(30) Foreign Application Priority Data

Feb. 27, 2020 (DE) .......................... 102020105094.1

(51) Int. Cl.
| | |
|---|---|
| *H02H 3/00* | (2006.01) |
| *H02H 1/00* | (2006.01) |
| *H03K 17/082* | (2006.01) |
| *H02H 3/087* | (2006.01) |
| *H02H 9/02* | (2006.01) |

(52) U.S. Cl.
CPC .......... *H02H 3/006* (2013.01); *H02H 1/0007* (2013.01); *H02H 3/087* (2013.01); *H02H 9/02* (2013.01); *H03K 17/082* (2013.01)

(58) Field of Classification Search
CPC ....... H03K 17/082–0828; H02H 3/006; H02H 9/02
See application file for complete search history.

(56) References Cited

U.S. PATENT DOCUMENTS

| | | | | |
|---|---|---|---|---|
| 2007/0052480 A1* | 3/2007 | Pastorina | ................ | G05F 3/262 |
| | | | | 330/288 |
| 2010/0014195 A1* | 1/2010 | Takahashi | ............ | H03K 17/687 |
| | | | | 361/18 |
| 2010/0148795 A1* | 6/2010 | Ostrom | .............. | G01R 19/0092 |
| | | | | 324/537 |
| 2019/0052074 A1* | 2/2019 | Asam | ................... | G01R 31/382 |

FOREIGN PATENT DOCUMENTS

| | | |
|---|---|---|
| DE | 102018119380 A1 | 2/2019 |
| DE | 102019102929 B3 | 7/2020 |
| EP | 2076951 B1 | 2/2017 |

* cited by examiner

*Primary Examiner* — Jared Fureman
*Assistant Examiner* — Christopher J Clark
(74) *Attorney, Agent, or Firm* — Slater Matsil, LLP (57) ABSTRACT

In accordance with an embodiment, a circuit includes: a supply pin and an output pin for connecting a load, and a configuration pin; a semiconductor switch connected between the supply pin and the output pin and configured to establish or to block a current path between the supply pin and the output pin depending on a control signal; and a control circuit configured to generate the control signal for the semiconductor switch taking account of a first parameter, and set the first parameter depending on a component parameter of an external component connected to the configuration pin. The first parameter is set to a first standard value when the component parameter is less than a first threshold value, and the first parameter is set to a second standard value when the component parameter is greater than a second threshold value.

20 Claims, 5 Drawing Sheets

SEMICONDUCTOR SWITCH CIRCUIT

This application claims the benefit of German Patent Application No. 102020105094.1, filed on Feb. 27, 2020, which application is hereby incorporated herein by reference in its entirety.

TECHNICAL FIELD

The present description relates to a semiconductor switch circuit.

BACKGROUND

Electronic switches are found in a multiplicity of applications. By way of example, with increasing electrification of automobiles more and more electronic switches are being installed in an automobile. Improved driving assistance systems and autonomous driving demand a high reliability. So-called "intelligent semiconductor switches" usually include one or more power transistors, serving as electronic switches, and also sensor and control electronics in a semiconductor chip. In this regard, intelligent semiconductor switches include a current measuring circuit, for example, in order to measure the load current of the power transistor. Current measurement values can be used for example for implementing an overcurrent protection function (e.g. overcurrent turn-off, current limiting, etc.). Intelligent semiconductor switches can also include a temperature measuring circuit in order to implement an over-temperature protection function.

Furthermore, intelligent semiconductor switches can output measurement values in order that the latter can be processed by a microcontroller, for example. For this purpose, known intelligent semiconductor switches can comprise a diagnosis pin, at which a current or a voltage can be output, which can represent a measurement value or one or more parameters of the intelligent semiconductor switch. These parameters can represent e.g. a fault code or the present value of a configurable parameter, such as e.g. a temperature or current threshold value.

Intelligent semiconductor switches can be configurable. That is to say that specific parameters (e.g. threshold value for current limiting, temperature threshold value, slew rate, etc.) of the semiconductor switch are not fixedly preset, but rather are able to be set by a user. If the intelligent semiconductor switch has a digital communication interface (e.g. a Serial Peripheral Interface, SPI), such parameters can be set and also read out relatively easily by way of specific control commands transmitted via the communication interface e.g. from a microcontroller to the intelligent semiconductor switch. In many applications, such a digital communication interface is not present, or is deliberately not used in order to increase the robustness of the overall system. Intelligent semiconductor switches can therefore comprise one or more configuration pins to which a resistor, for example, can be connected. In this case, the resistance value of the resistor determines a specific parameter value used in the intelligent semiconductor switch. By way of example, a temperature threshold value of the intelligent semiconductor switch that is critical for a safety function can be defined by the user by means of an external resistor connected to a configuration pin. The parameter is set reliably by means of hardwired hardware and is not dependent on a digital (possibly software-controlled) transmission.

However, even a hardwired component can fail for a wide variety of reasons (e.g. faulty soldered joint, etc.) or its characteristic (e.g. resistance value) can change over time, which, under certain circumstances, can change a safety-critical parameter of the intelligent semiconductor switch. In view of the currently applicable standards for functional safety (ISO 26262), there is a need to improve existing concepts with regard to intelligent semiconductor switches, in particular in regard to functional safety and robustness of the application.

SUMMARY

A circuit which can be operated as an intelligent semiconductor switch is described. In accordance with one exemplary embodiment, the circuit comprises a supply pin and an output pin for connecting a load, and also a configuration pin. The circuit further comprises a semiconductor switch connected between the supply pin and the output pin and configured to establish or to block a current path between the supply pin and the output pin depending on a control signal. A control circuit is configured to generate the control signal for the semiconductor switch taking account of a first parameter, and to set the first parameter depending on a component parameter of an external component connected to the configuration pin. The first parameter is set to a first standard value if the component parameter is less than a first threshold value, and the first parameter is set to a second standard value if the component parameter is greater than a second threshold value.

Furthermore, a method for an intelligent semiconductor switch is described. In accordance with one exemplary embodiment, the method comprises setting a first parameter depending on a component parameter of an external component connected to a configuration pin. In this case, the first parameter is set to a first standard value if the component parameter is less than a first threshold value, and it is set to a second standard value if the component parameter is greater than a second threshold value. The method further comprises generating a control signal for a semiconductor switch taking account of the first parameter.

BRIEF DESCRIPTION OF THE DRAWINGS

Exemplary embodiments are explained in greater detail below with reference to drawings. The illustrations are not necessarily true to scale and the exemplary embodiments are not just restricted to the aspects illustrated. Rather, importance is attached to illustrating the principles underlying the exemplary embodiments. With regard to the drawings.

DETAILED DESCRIPTION OF ILLUSTRATIVE EMBODIMENTS

Various embodiments related to intelligent semiconductor switches, in particular to an intelligent semiconductor switch with the possibility of configuring specific parameters of the intelligent semiconductor switch.

Figure 1:
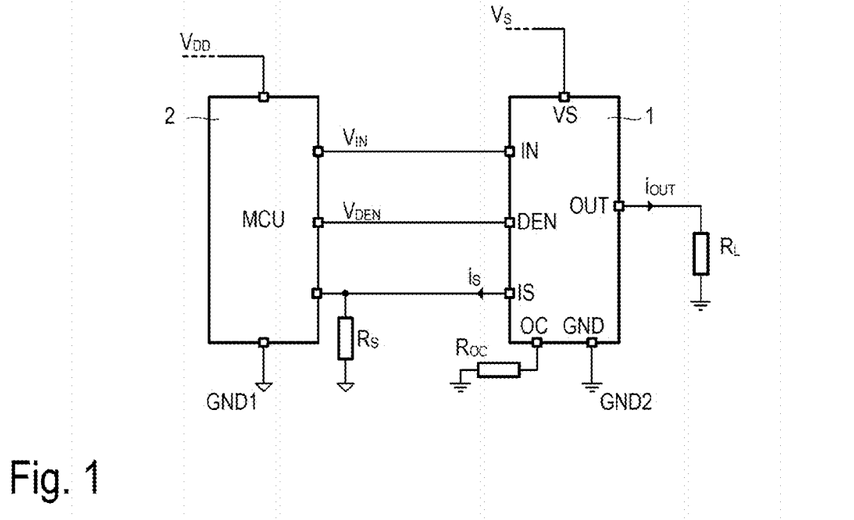
FIG. 1 illustrates an exemplary application of an intelligent semiconductor switch in which the intelligent semiconductor switch is controlled by means of a microcontroller.

FIG. 1 illustrates a simple example of the use of an intelligent semiconductor switch 1 in an electronic control unit (ECU). In the example illustrated, the ECU comprises a microcontroller 2 (microcontroller unit, MCU) configured to control the intelligent semiconductor switch 1 in order, for example, to switch a load on and off. It goes without saying that the resistor RL in FIG. 1 symbolizes any electrical load. In automotive applications such as e.g. in driving assistance systems, said load can be for example a radar system, a camera or any other electrical subsystem.

In the example from FIG. 1, the intelligent semiconductor switch comprises a supply pin VS, a ground pin GND, an output pin OUT, a first input pin IN, a second input pin DEN (diagnosis pin), a diagnosis output pin IS and a configuration pin OC. It goes without saying that this is not a complete enumeration. The intelligent semiconductor switch 1 can comprise e.g. a plurality of output channels with a plurality of output pins or else a plurality of configuration pins. In some exemplary embodiments, the intelligent semiconductor switch, as mentioned, can also comprise a digital communication interface with the associated input/output pins. The design of the pins depends on the chip package used in which the semiconductor chip in which the intelligent semiconductor switch is integrated is arranged. In the case of SMD packages, the pins are embodied as solder pins. In other types of chip packages, the pins can be embodied as solder balls.

A supply voltage $V_S$ is fed to the supply pin VS, which supply voltage can be made available by an automobile battery, for example. The power transistor contained in the intelligent semiconductor switch 1 couples the supply pin VS to the output pin OUT. With the power transistor switched on, the load $R_S$ is thus supplied with the supply voltage $V_S$ (disregarding the voltage drop across the power transistor) and a corresponding load current $i_{OUT}$ can flow through the transistor and the load $R_L$. The ground pin GND is connected to a ground GND2, which need not necessarily be the same ground as the ground GND1 used for the microcontroller 2. The input signal $V_{IN}$ received at the input pin IN indicates whether the power transistor is intended to be switched on or off. The input signal $V_{IN}$ is usually a binary logic signal (having the levels "high" and "low"), which is generated by the microcontroller 2 in the example illustrated. By setting the level of the input signal $V_{IN}$ to a high level or a low level, the microcontroller 2 can switch the intelligent semiconductor switch 1 on or off, respectively.

The diagnosis function will be discussed in even greater detail later. Applying a suitable logic level (diagnosis request signal $V_{DEN}$) to the diagnosis pin DEN can cause the intelligent semiconductor switch 1 to output diagnosis information (e.g. current measurement value, fault codes, etc.) at the diagnosis output pin IS. In the present example, the intelligent semiconductor switch outputs a diagnosis current $i_s$ at the pin IS, said diagnosis current including the diagnosis information. At the resistor $R_S$ coupled between the pin IS and ground GND1, the diagnosis current $i_s$ generates a corresponding voltage drop $i_s \cdot R_S$, which for example can be received at an analog input of the microcontroller 2 and digitized.

As mentioned in the introduction, the intelligent semiconductor switch 1 can comprise one or more configuration pins. In the present example, the configuration pin OC is provided in order to set a current threshold value used in the intelligent semiconductor switch 1. This operating parameter (the current threshold value in the present example) is defined by a component parameter (e.g. resistance value) of an external component (e.g. resistance value) connected to the configuration pin OC.

Figure 2:
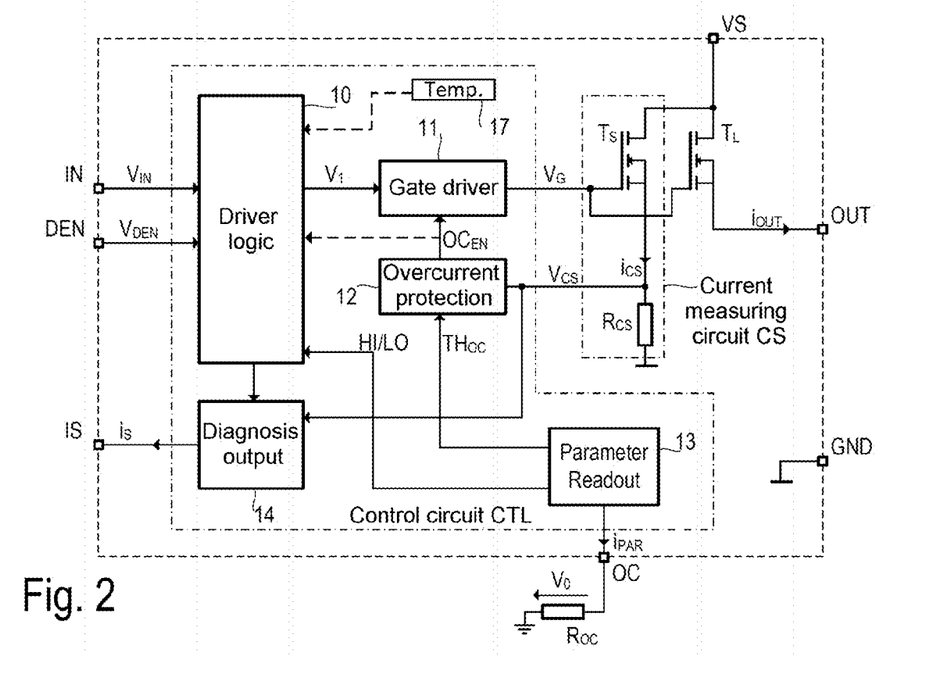
FIG. 2 illustrates an exemplary embodiment of an intelligent semiconductor switch in which a parameter is set depending on a component parameter of an external component connected to a configuration pin.

FIG. 2 illustrates one exemplary embodiment of an intelligent semiconductor switch in greater detail. In accordance with FIG. 2, the load current path of the power transistor TL connects the supply pin VS to the output pin OUT. In the examples illustrated here, the power transistors are embodied as MOS transistors; the load current path is the drain-source current path in these cases. The power transistor $T_L$ is configured as a high-side switch, i.e. it is arranged between the load RL and the supply voltage $V_S$. It should be noted at this juncture that the concepts described here can easily be applied to intelligent semiconductor switches comprising low-side switches. In some exemplary embodiments, the power transistor is accordingly arranged between output pin OUT and ground pin GND. Both p-channel and re-channel MOS transistors can be used. Other transistor types such as e.g. bipolar transistors can also be used.

The current measuring circuit for measuring the load current $i_{OUT}$ as illustrated in FIG. 2 is based on the sense FET concept known per se. Accordingly, a measuring transistor $T_S$ (sense transistor) is coupled to the power transistor TL such that power transistor TL and measuring transistor are operated substantially at the same operating point. In this case, the current $i_{CS}$ through the measuring transistor $T_S$ is approximately proportional to the current $i_{OUT}$ through the power transistor $T_L$, such that the current $i_{CS}$ can be used as a measurement value for the current $i_{OUT}$. The proportionality factor $k=i_{CS}/i_{OUT}$ is substantially determined by the ratio of the active areas of the transistors $T_S$ and $T_L$. The current $i_{CS}$ causes a voltage drop $V_{CS}$ across the resistor $R_{CS}$ that can be connected between the source of the transistor $T_S$ and ground. The voltage $V_{CS}$ is thus also substantially proportional to the output current $i_{OUT}$ and can be used as a current measurement value. It goes without saying that the current measuring circuit illustrated in FIG. 2 is merely a simplified example and actual implementations may be significantly more complex depending on the application. However, current measuring circuits according to the sense FET principle are known per se and will not be discussed further here. Other types of current measurement such as e.g. a simple current measuring resistor coupled to the power transistor $T_L$ can also be used.

The power transistor $T_L$ is usually controlled by means of a driver circuit 11, which is referred to as a gate driver in the case of MOS transistors. In the example illustrated, the gate driver 11 receives a logic signal $V_1$ indicating whether the power transistor $T_L$ is intended to be switched on or off. On the basis of said logic signal $V_1$, the gate driver 11 generates a suitable gate voltage $V_G$ or a suitable gate current in order to switch the power transistor $T_L$ on or off. The construction and functioning of gate driver circuits are known per se and, therefore, will not be discussed in greater detail here. An overcurrent protection circuit 12 can also be coupled to the gate driver circuit 11, said overcurrent protection circuit being configured for example to limit the controlling of the gate electrode to an extent such that the resulting load current $i_{OUT}$ is limited to a maximum value $i_{OUT,max}$, which is dependent on the current threshold value $TH_{OC}$, for example. Even though gate driver 11 and overcurrent protection circuit 12 are illustrated as separate blocks in the example illustrated, the gate driver 11 can nevertheless contain the overcurrent protection circuit 12. The current limiting function is active if the current measurement value $V_{CS}$ indicates that the load current $i_{OUT}$ has reached the maximum value $i_{OUT,max}$.

In another exemplary embodiment, an overcurrent turn-off is provided instead of current limiting. To that end, the overcurrent protection circuit 12 checks whether the load current $i_{OUT}$ has reached or exceeded a predefined threshold value $i_{TRIP}$ (often referred to as "trip current"). The overcurrent protection circuit 12 can then signal to the gate driver the fact that the threshold value $TH_{OC}$ has been reached or exceeded (overcurrent signal $OC_{EN}$), said gate driver thereupon causing the transistor $T_L$ to be turned off. Alternatively, the overcurrent signal $OC_{EN}$ can cause the driver logic 10 to blank the logic signal $V_1$ (and set it e.g. to a low level) in order to cause the transistor $T_L$ to be turned off. FIG. 2 likewise illustrates a temperature sensor 17 configured to measure a chip temperature. The driver logic can cause an over-temperature turn-off of the semiconductor switch $T_L$ on the basis of the measured chip temperature. In some exemplary embodiments, a plurality of temperature sensors are provided in order to measure temperature differences at the chip. Excessively high differential temperatures can also necessitate turning off the semiconductor switch $T_L$. An overcurrent turn-off can also be implemented by a procedure in which, with the load transistor $T_L$ switched on, the voltage drop across the load current path of the transistor (i.e. the drain-source voltage VDs) is compared with an associated threshold value $V_{DSmax}$. If said threshold value is exceeded ($V_{DS} \geq V_{DSmax}$), the transistor $T_L$ is turned off (overcurrent turn-off). In this respect, the threshold value used for an overcurrent turn-off can also be the maximum drain-source voltage $V_{DSmax}$ with the transistor $T_L$ switched on.

The driver logic 10 mentioned is a logic circuit that receives the input signals $V_{IN}$ and $V_{DEN}$ and performs certain control functions depending on the levels of the input signals $V_{IN}$ and $V_{DEN}$. By way of example, as a reaction to a high level of the input signal $V_{IN}$, the logic circuit 10 can generate the control signal $V_1$ with a corresponding high level in order to switch on the power transistor $T_L$. However, the logic circuit 10 can prevent switching on or trigger switching off of the transistor $T_L$ if this is necessary e.g. on account of an identified overcurrent situation or an over-temperature.

Parameters such as the threshold values for current limiting, overcurrent turn-off (for example on account of the condition $V_{DS} \geq V_{DSmax}$), over-temperature turn-off, etc. can be configurable in order to adapt the intelligent semiconductor circuit to the desired application. In the example illustrated in FIG. 2, the threshold value $TH_{OC}$ used for current limiting is configurable. It goes without saying that other parameters such as e.g. a temperature threshold value can also be configured in the same way. As mentioned, the threshold value $TH_{OC}$ is defined by a component parameter of a component connected to the configuration pin OC. In the example illustrated, the component parameter is the resistance value of the resistor $R_{OC}$. In the example illustrated in FIG. 2, a first terminal of the resistor $R_{OC}$ is connected to the configuration pin OC and a second terminal of the resistor $R_{OC}$ is connected to ground. It goes without saying that the resistor $R_{OC}$ can also be connected between the configuration pin OC and a circuit node at which the supply voltage $V_S$ is present. Alternatively, the resistor $R_{OC}$ can also be connected between the configuration pin OC and an arbitrary (constant) reference voltage.

The parameter readout circuit 13 (parameter readout circuit) is configured to generate, on the basis of the resistance value $R_{OC}$, a signal representing the operating parameter sought (e.g. the threshold value $TH_{OC}$). For this purpose, the parameter readout circuit 13 can be configured to output a test current $i_{PAR}$ at the configuration pin OC and to regulate said test current $i_{PAR}$ such that the resulting voltage $V_o = R_{OC} \cdot i_{PAR}$ corresponds to a predefined, constant value (e.g. $V_o = 0.5$ volt). The test current $i_{PAR}$ then unambiguously represents the resistance value $R_{OC}$ ($i_{PAR} = V_o/R_{OC}$) and the parameter sought (e.g. threshold value $TH_{OC}$) can be set depending on the test current $i_{PAR}$. It goes without saying that, in other examples, the current $i_{PAR}$ can also be regulated in a constant manner, such that the resulting voltage $V_o$ represents the resistance value $R_{OC}$. In accordance with FIG. 2, the threshold value $TH_{OC}$ is fed to the overcurrent protection circuit 12, and is used by the latter for the current limiting of the output current $i_{OUT}$. That is to say that the threshold value $TH_{OC}$ defines the maximum output current $i_{OUT,max}$.

FIG. 2 likewise illustrates the diagnosis output circuit 14 (sense output circuit), which is configured to output diagnosis information in the form of a diagnosis current $i_s$ for example. The diagnosis current $i_s$ can have different meanings depending on the state of the intelligent semiconductor switch 1. If the power transistor $T_L$ is switched on (i.e. input signal $V_{IN}$ has a high level) and the diagnosis request signal $V_{DEN}$ assumes a high level, then the diagnosis current $i_s$ represents the current measurement signal $i_{CS}$. If the power transistor $T_L$ is switched off (i.e. input signal $V_{IN}$ has a low level or a fault is present) and the diagnosis request signal $V_{DEN}$ assumes a high level, then the diagnosis current represents status information, such as a fault code, for example. For this purpose, the diagnosis output circuit 14 can comprise a multiplicity of controllable current sources that can be activated and deactivated by the driver logic 10 in order to output the desired current $i_s$ at the diagnosis output pin IS.

Figure 3:
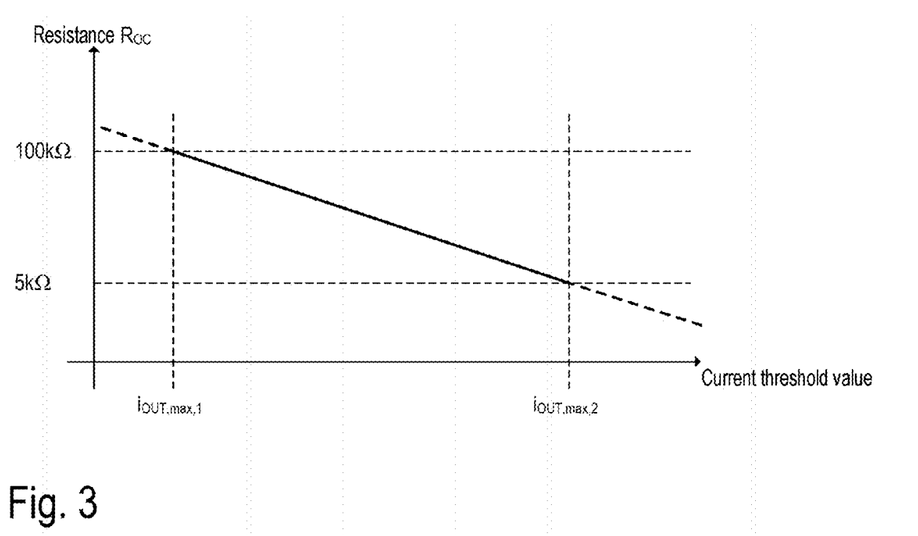
FIGS. 3 and 4 illustrate by way of example a relationship between the component parameter of the component connected to the configuration pin and the parameter to be set of the intelligent semiconductor switch.

FIG. 3 illustrates by way of example the relationship between the component parameter of the component connected to the configuration pin (resistance $R_{OC}$ in the example from FIG. 2) and the parameter $TH_{OC}$ to be set of the intelligent semiconductor switch. Accordingly, it is possible to set the maximum output current $i_{OUT,max}$ for current limiting between $i_{OUT,max,1}$ and $i_{OUT,max,2}$. In the exemplary embodiments described here, the associated resistance values of the resistor $R_{OC}$ vary between vary between 5 kΩ and 100 kΩ In this case, 100 kΩ corresponds to a maximum output current $i_{OUT,max,1}$ and 5 kΩ corresponds to a maximum output current $i_{OUT,max,2}$.

The characteristic curve illustrated in FIG. 3 can be continued on both sides. That is to say that, for the example illustrated, resistances of more than 100 kΩ would result in current limiting to a maximum current of less than $i_{OUT,max,1}$, and resistances of less than 5 kΩ would result in current limiting to a maximum current of more than $i_{OUT,max,2}$. Both can lead to dangerous situations since the current limiting becomes ineffective (maximum current too high) or the load can no longer be operated normally (maximum current too low). Such situations can occur particularly if the resistor $R_{OC}$ is defective and forms either a short circuit or an open circuit. An open circuit may be the consequence of a defective soldered joint, for example.

Figure 4:
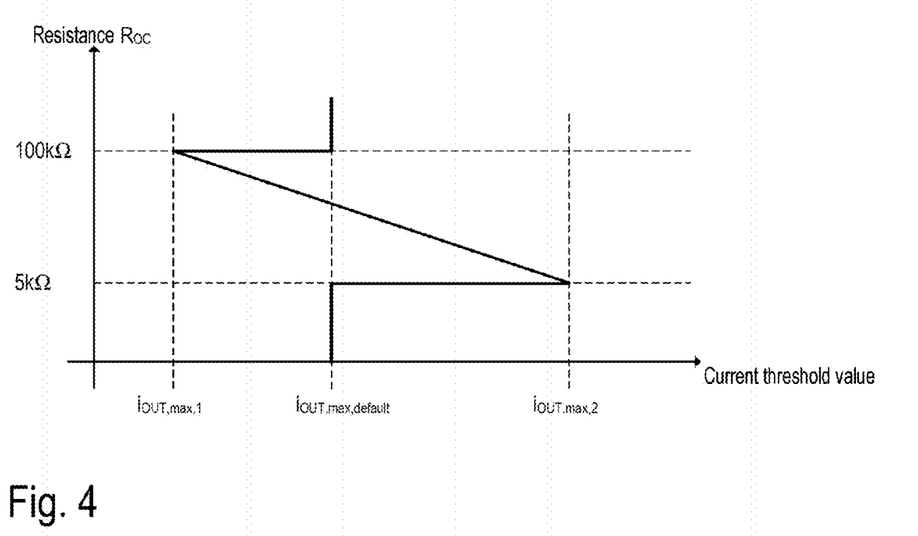

As mentioned in the introduction, it may be important for the functional safety of a system that a singular fault, such as a faulty (or faultily connected) resistor $R_{OC}$, for example, does not make it impossible to continue the operation of the overall system. The overall system is thus intended to remain in a functional state despite the fault (fail functional). With regard to the parameter configuration by means of externally connected components (resistors), the characteristic curve in FIG. 4 illustrates a solution to the problem outlined above. In accordance with this exemplary embodiment, the intelligent semiconductor circuit 1 (e.g. the parameter readout circuit 13, see FIG. 2) is configured to set the parameter to be set (e.g. threshold value $TH_{OC}$ representing the maximum current $i_{OUT,max}$) to a first standard value if the component parameter is less than a first threshold value (e.g. $R_{OC} < R_{OCmin}$, $R_{OCmin} \approx 5$ kW, and to set it to a second standard value if the component parameter is greater than a second threshold value (e.g. $R_{OC} > R_{OCmax}$, $R_{OCmax} \approx 100$ kW. In the example illustrated in FIG. 4, the first and second standard values are identical and designated by $i_{OUT,max,default}$. It goes without saying that the first standard value and the second standard value can also be different, but are within the range of $i_{OUT,max,1}$ and $i_{OUT,max,2}$.

With a characteristic curve in accordance with FIG. 4, it is possible to ensure that the relevant parameter, that is to say e.g. the current threshold value $i_{OUT,max}$, remains in a "normal" range in which the load can continue to be operated (possibly with restrictions) even in the case of a faulty resistor $R_{OC}$ (e.g. short circuit or open circuit). Furthermore, the intelligent semiconductor circuit 1 (e.g. the parameter readout circuit 13, see FIG. 2) can be configured to detect that the component parameter (e.g. the resistance $R_{OC}$) is less than the first threshold value or greater than the second threshold value, and can output this information on request (see FIG. 2, diagnosis request signal $V_{DEN}$) in the form of a corresponding diagnosis current $i_s$ at the diagnosis output pin IS.

Figure 5:
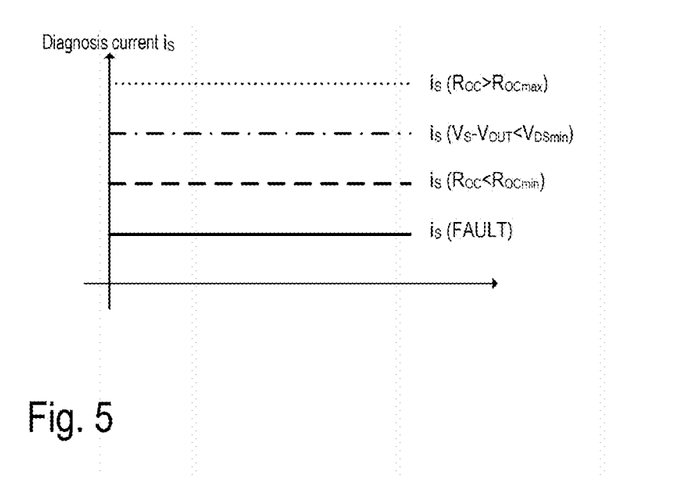
FIG. 5 illustrates the encoding of information in the diagnosis current.

FIG. 5 illustrates the encoding of information in the diagnosis current $i_s$ output on request (diagnosis request signal $V_{DEN}$ is at a high level) at the pin IS. This is merely an illustrative example with four different current levels. Depending on applications, more or fewer current levels can also be used for encoding information. The example from FIG. 5 concerns a situation in which a low level is present at the input pin IN (power transistor $T_L$ off) and a high level is present at the input pin DEN (diagnosis request). In this case, the diagnosis current $i_s$ has one of the four values illustrated in FIG. 5. In the example illustrated, the lowest current value indicates a general fault, which may be triggered by an over-temperature, for example. The second current level (from the bottom) indicates that the resistance $R_{OC}$ (see FIG. 2) is too low and a short circuit is possibly present. The third current value indicates a faulty situation in which the voltage $V_{OUT}$ at the output pin OUT is too high, that is to say if the difference $V_S$-$V_{OUT}$ is less than a threshold value $V_{DS,min}$. The fourth, highest current value indicates that the resistance $R_{OC}$ (see FIG. 2) is too high and an open circuit is possibly present. The microcontroller (see FIG. 1) can evaluate the diagnosis current and e.g. inform a superordinate control unit and/or initiate certain emergency measures (e.g. safely bringing the autonomous vehicle to a stop and parking it).

One example of a method implemented in an intelligent semiconductor switch for configuring an operating parameter (e.g. a current threshold value) of the intelligent semiconductor switch is illustrated in the flow diagram in FIG. 6 and is summarized below. In accordance with FIG. 6, firstly a value is ascertained (e.g. the test current $i_{PAR}$, mentioned above, cf. FIG. 2) which represents a component parameter of an external component $R_{OC}$ connected to a configuration pin (see FIG. 6, step S1). As explained above, e.g. a test current $i_{PAR}$ can be fed into the resistor $R_{OC}$ connected to the configuration pin OC, and said test current $i_{PAR}$ can be regulated such that the voltage $V_o$ at the configuration pin OC assumes a predefined value. In this case, the test current $i_{PAR}$ can be regarded as a measurement value for the resistance $R_{OC}$.

Figure 6:
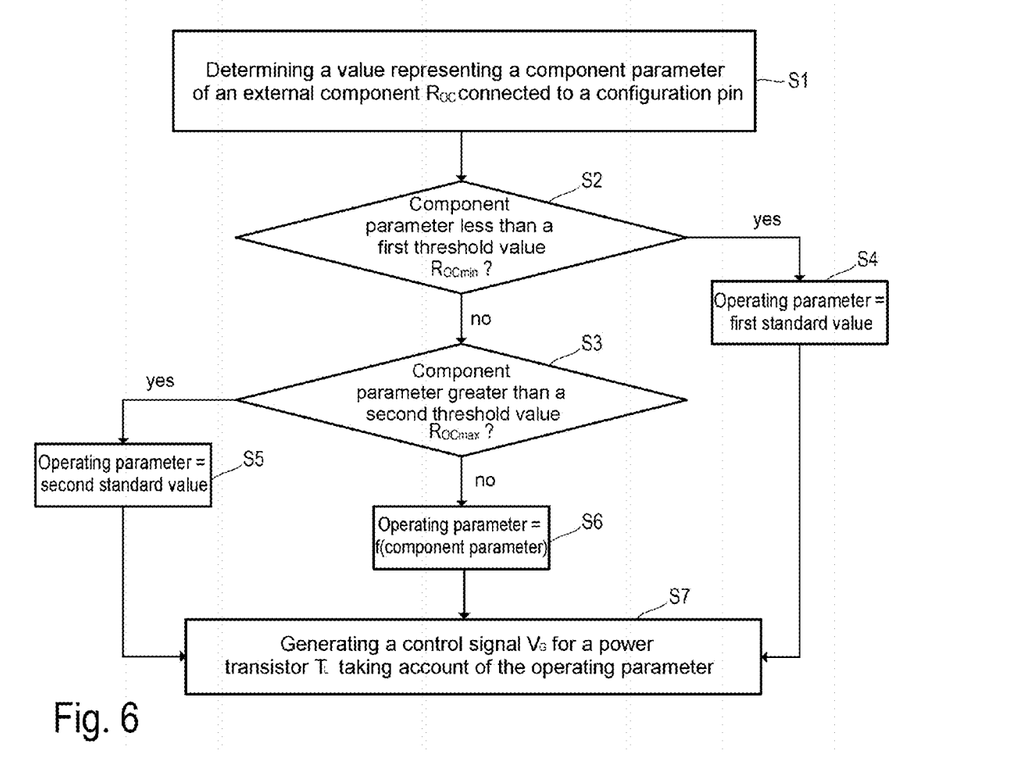
FIG. 6 illustrates a flow diagram of one example of a method for an intelligent semiconductor switch for configuring operating parameters of the intelligent semiconductor switch.

Afterward, a check is made to establish whether the component parameter $R_{OC}$ is less than a first threshold value $R_{OCmin}$ (see FIG. 6, step S2). If yes (short circuit detected at the resistor $R_{OC}$), the operating parameter to be configured is set to the first standard value (see FIG. 6, step S4, standard value $i_{OUT,max,default}$). If no, a check is made to establish whether the component parameter $R_{OC}$ is greater than a second threshold value $R_{OCmax}$ (see FIG. 6, step S3). If yes (open circuit detected at the resistor $R_{OC}$), the operating parameter to be configured is set to the second standard value (see FIG. 6, step S5, standard value $i_{OUT,max,default}$). If no, the (measured) component parameter determines the operating parameter sought (see FIG. 6, step S6). In other words, the operating parameter sought (e.g. current threshold value $i_{OUT,max}$) is a function of the component parameter (resistance $R_{OC}$). One example of this function is illustrated in FIG. 4. Afterward, a control signal (e.g. gate voltage $V_G$) for the power transistor is generated, the configured operating parameter being taken into account (see FIG. 6, step S7). In the case of current limiting, the gate voltage is generated such that the load current $i_{OUT}$ cannot rise above the maximum value $i_{OUT,max}$ determined by the operating parameter. Said maximum value, as described above, is either one of the two standard values or dependent (within the predefined limits) on the resistance value of the external resistor (e.g. $i_{OUT,max} \sim 1/R_{OC}$ for $R_{OCmin} < R_{OC} < R_{OCmax}$).

Furthermore, the method—as already mentioned above—can comprise a step according to which a diagnosis signal (e.g. diagnosis current $i_s$) is output which, depending on a diagnosis request signal (see FIG. 2, signal $V_{DEN}$ at the input pin DEN), indicates whether the component parameter (e.g. resistance $R_{OC}$) is less than the first threshold value $R_{OC}$ or greater than the second threshold value $R_{OCmax}$ (cf. FIG. 5).

In the exemplary embodiment described here, the maximum current $i_{OUT,max}$ used in the current limiting is cited as an example of a configurable parameter. Additionally or alternatively, other parameters can also be configured in the same way, for example an over-temperature threshold value, a maximum delta temperature (temperature difference) at the semiconductor chip, a threshold value for the overcurrent turn-off (trip current), a threshold value for an estimated cable temperature of a cable connected to the output pin, etc.

Figure 7:
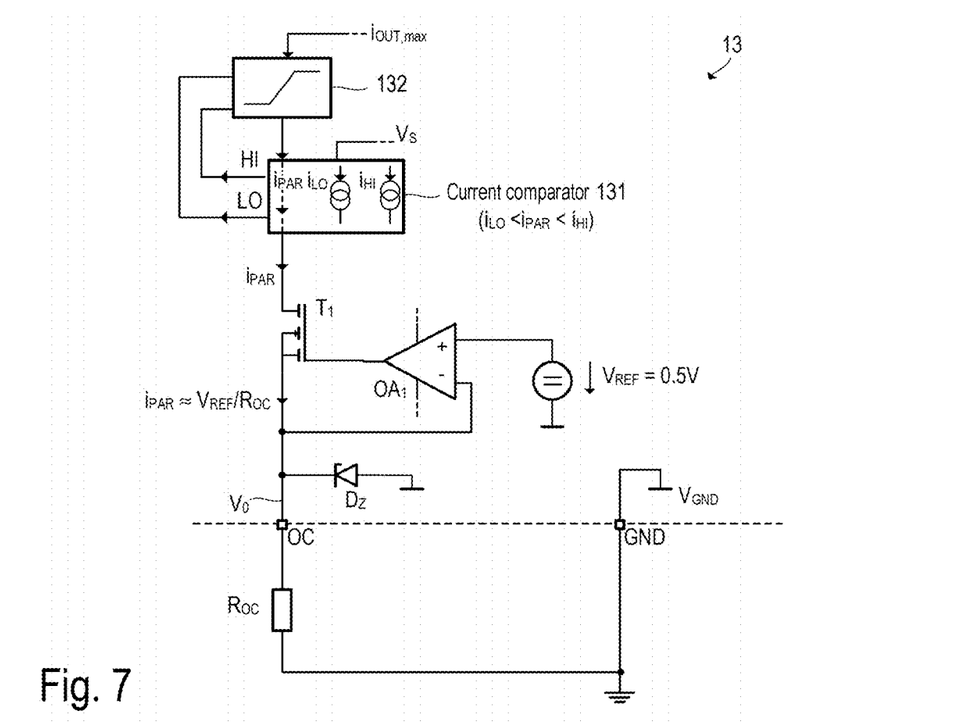
FIG. 7 illustrates an example of a possible implementation of a parameter readout circuit which can be used in the intelligent semiconductor switch from FIG. 2.

FIG. 7 illustrates an example of a possible implementation of the parameter readout circuit 13 of the intelligent semiconductor switch illustrated in FIG. 2. FIG. 7 shows the configuration pin OC and the ground pin GND. As already described with reference to FIG. 2, the ground pin is connected to a ground potential $V_GND$ and a resistor $R_{OC}$ is externally connected to the configuration pin OC. The parameter readout circuit 13 is configured to set the voltage $V_o$ at the configuration pin OC (and therefore also the voltage drop across the resistor $R_{OC}$) to a constant predefined reference value $V_{REF}$ (e.g. $V_{REF}$=0.5 V). The current $i_{PAR}$ output at the configuration pin OC is then inversely proportional to the resistance $R_{OC}$, i.e. $i_{PAR}=V_{REF}/R_{OC}$.

The current $i_{PAR}$ is provided by means of a transistor $T_1$ coupled to the configuration pin OC such that the load current path of the transistor $T_1$ is connected in series with the resistor $R_{OC}$. In the example illustrated, the control electrode of the transistor $T_1$ (the gate electrode in the case of a MOS transistor) is controlled by means of an operational amplifier $OA_1$ such that the voltage $V_o$ at the configuration pin OC is equal to the reference voltage $V_{REF}$. For this purpose, the voltage $V_o$ is fed back to the inverting input of the operational amplifier $OA_1$, while the reference voltage $V_{REF}$ is present at the noninverting input. The operational amplifier $OA_1$ will control the transistor $T_1$ such that the differential voltage $V_{REF}-V_1$ at its inputs is approximately zero volts, which results in $V_1 \approx V_{REF}$. The Zener diode $D_z$ is optional and prevents excessively high voltages at the configuration pin OC. At this juncture it should be pointed out again that the resistance value $R_{OC}$ represents the parameter to be configured, and $i_{PAR}$ thus also represents the parameter to be configured.

The current $i_{PAR}=V_{REF}/R_{OC}$ is fed to the current comparator 131, which is configured to compare the current $i_{PAR}$ with a lower threshold value $i_{LO}$ and an upper threshold value $i_{HI}$ (where $i_{LO}<i_{HI}$). The binary (logic) signal LO indicates whether the condition $i_{PAR}<i_{LO}$ is met, and the binary signal HI indicates whether the condition $i_{PAR}>i_{HI}$ is met. The limiting circuit 132 prevents the limit value $i_{OUT,max}$ used for the current limiting from becoming too small or too large. In the normal case it holds true that $i_{OUT,max}=i_{PAR}$. However, if—for example on account of a short circuit of the resistor $R_{OC}$—the current $i_{PAR}$ is too large (i.e. $i_{PAR}>i_{LO}$), then the limiting circuit 132 outputs the standard value $i_{OUT,max}$ as limit value $i_{OUT,max}=i_{OUT,max,2}$. If—for example on account of an open circuit at the configuration pin OC (i.e. $R_{OC}$ is too high)—the current $i_{PAR}$ is too small (i.e. $i_{PAR}<i_{LO}$), then the limiting circuit 132 outputs the standard value $i_{OUT,max}$ as limit value $i_{OUT,max}=i_{OUT,max,1}$. An exemplary implementation of the current comparator 131 and of the limiting circuit 132 will be discussed in greater detail later with reference to FIG. 9. In the present example, the external resistor $R_{OC}$ is connected between the configuration pin OC and ground GND. It goes without saying that in a different exemplary embodiment the resistor $R_{OC}$ can also be connected between the configuration pin OC and a supply voltage node (at which the voltage $V_S$ is present). The parameter readout circuit 13 would merely have to be slightly modified in this case (e.g. replacing the n-channel transistor $T_1$ with a complementary transistor, etc.).

Figure 8:
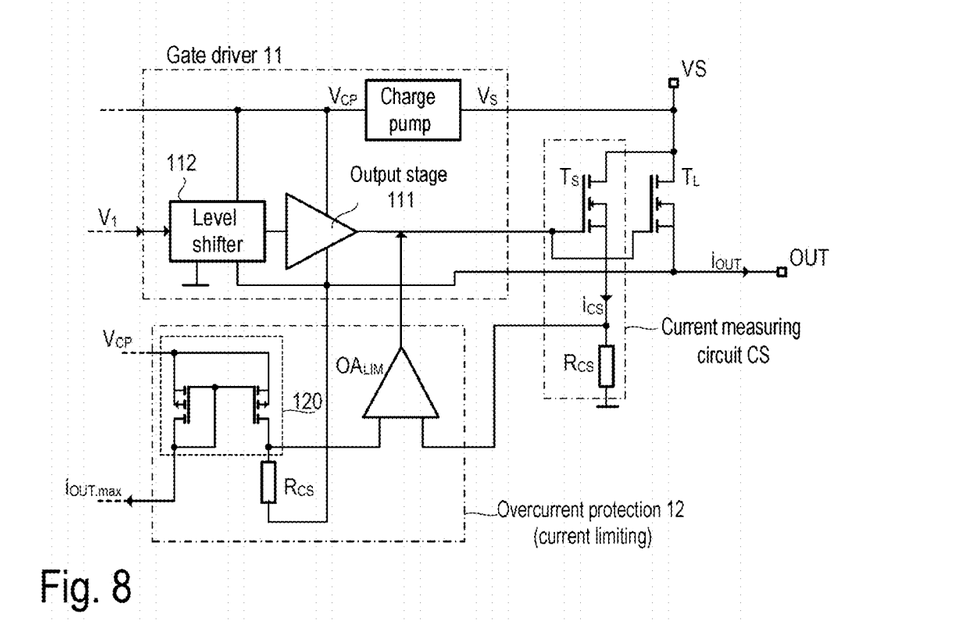
FIG. 8 illustrates an example of a possible implementation of a gate driver and of a current limiting circuit which can be used in the intelligent semiconductor switch from FIG. 2.

FIG. 8 illustrates an example of a possible implementation of the gate driver 11 and of the current limiting circuit 12 from FIG. 2. The current limiting circuit 12 is configured to limit the output current $i_{OUT}$ of the intelligent semiconductor switch depending on the limit value $i_{OUT,max}$. FIG. 8 shows the power transistor $T_L$, which couples the supply pin VS and the output pin OUT, and also the current measuring transistor $T_S$, which has already been discussed with reference to FIG. 2. The gate driver 11 substantially comprises a level shifter 112, which "shifts" the logic signal $V_1$ into the floating supply domain of the gate driver 11, and an output stage 111, which provides a corresponding gate signal $V_G$ for the power transistor $T_L$ depending on the level-shifted logic signal. In the example illustrated, the gate driver 11 also contains a charge pump, which generates from the supply voltage $V_S$ a higher supply voltage $V_{CP}$ used to supply the output stage in and the level shifter 112. The construction and functioning of a gate driver 11 are known per se and, therefore, will not be discussed in any greater detail here.

In the present example, the overcurrent protection circuit 12 operates substantially like a current limiter. The overcurrent protection circuit 12 includes an operational amplifier $OA_{LIM}$, which is coupled to the output of the gate driver 11 and "clamps" the gate voltage $V_G$ if the output current $i_{OUT}$ provided by the transistor $T_L$ reaches a maximum value represented by the current $i_{OUT,max}$. The construction and functioning of current limiting are known per se and, therefore, will not be discussed in greater detail here. In the present example, the operational amplifier $OA_{LIM}$ "sees" the voltages $V_{CS}=R_{CS} \cdot i_{CS}$ and the voltage $R_{CS} \cdot i_{OUT,max}$ at its inputs, the voltage $R_{CS} \cdot i_{OUT,max}$ being generated by means of a resistor connected to the output branch of a current mirror 120 that mirrors the current $i_{OUT,max}$ (from the limiting circuit 132, see FIG. 7). The current mirror 120 also serves to shift the voltage $R_{CS} \cdot i_{OUT,max}$ into the supply domain of the gate driver 11 (supply voltage $V_{CP}$; reference is the source voltage of the transistor $T_L$).

Figure 9:
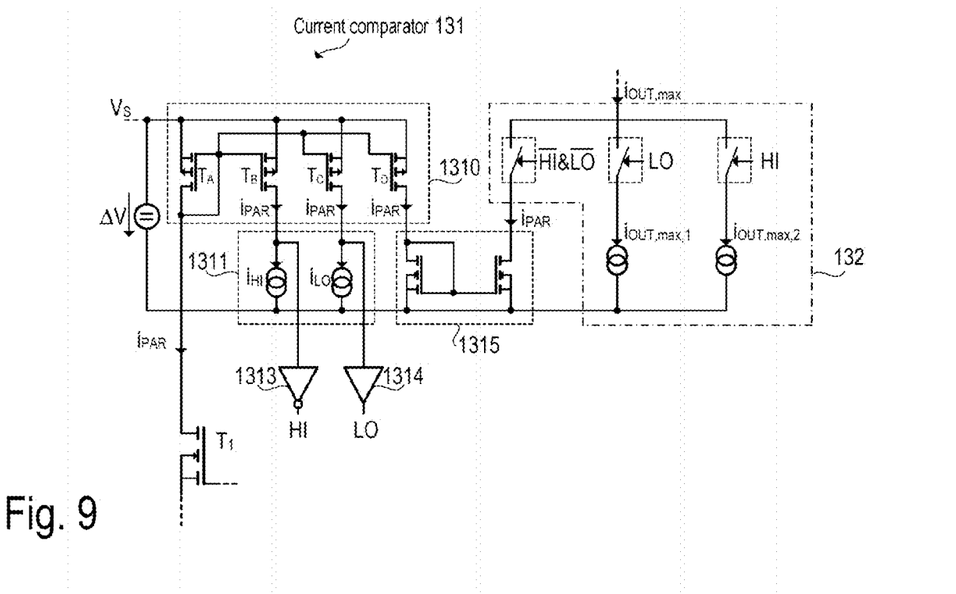
FIG. 9 illustrates a part of the circuit from FIG. 7 in greater detail.

FIG. 9 illustrates a part of the circuit from FIG. 7 in greater detail, namely the current comparator 131 and the limiting circuit 132. In accordance with FIG. 9, the current comparator 131 includes a current mirror 1310 having a transistor TA in the input branch and the transistors TB, $T_c$ and $T_D$ in the three output branches. In the present example, the current mirror 1310 is designed such that all three outputs supply the same current $i_{PAR}$. A respective current source is coupled to the first and second outputs of the current mirror (source currents $i_{HI}$ and $i_{LO}$, respectively). If the output current $i_{PAR}$ of the respective output branch of the current mirror 1310 is less than the corresponding source current $i_{HI}$ and $i_{LO}$, respectively, then the voltage at the respective output of the current mirror assumes a high level. Conversely, if the output current $i_{PAR}$ of the respective output branch of the current mirror 1310 is greater than the corresponding source current $i_{HI}$ and $i_{LO}$, respectively, then the voltage at the respective output of the current mirror assumes a low level. The buffers 1313 (inverting) and 1314 (noninverting) are connected to the respective outputs. The output signals HI, LO of the buffers 1313 and 1314 thus indicate whether the conditions $i_{PAR}>6$ and $i_{PAR}<i_{LO}$ are met. The third output branch likewise supplies the current $i_{PAR}$, which is fed to the limiting circuit 132 via the further current mirror 1315. Various implementation possibilities for current comparators are known per se and, therefore, will not be discussed further here. FIG. 9 merely contains an illustrative example, with other implementations also being possible.

The limiting circuit 132 is configured to output the (multiply mirrored) current $i_{PAR}$ as limit value $i_{OUT,max}$ if both conditions, $i_{PAR}>i_{HI}$ and $i_{PAR}<i_{LO}$, are not met, i.e. the current $i_{PAR}$ is between the values $i_{LO}$ and $i_{HI}$. If the condition $i_{PAR}<i_{LO}$ is met, the current $i_{OUT,max,1}$ is output as limit value $i_{OUT,max}$. If the condition $i_{PAR}>i_{HI}$ is met, the current $i_{OUT,max,2}$ is output as limit value $i_{OUT,max}$. The standard values $i_{OUT,max,1}$ and $i_{OUT,max,2}$ can be provided by way of current sources. In the present example, the switching between the configured value $i_{PAR}$ and the standard values $i_{OUT,max,1}$ and $i_{OUT,max,2}$ is implemented by means of switches that are controlled depending on the output signals HI, LO of the buffers 1313 and 1314. As mentioned in the introduction, the standard values $i_{OUT,max,1}$ and $i_{OUT,max,2}$ can be identical. The implementation of the limiting circuit 132 is simplified in this case. As a result, the limiting circuit 132 ensures that the limit value $i_{OUT,max}$ is always between iHI and iLO and—if that were not the case—instead the standard values are used for the subsequent current limiting.

Figure 10:
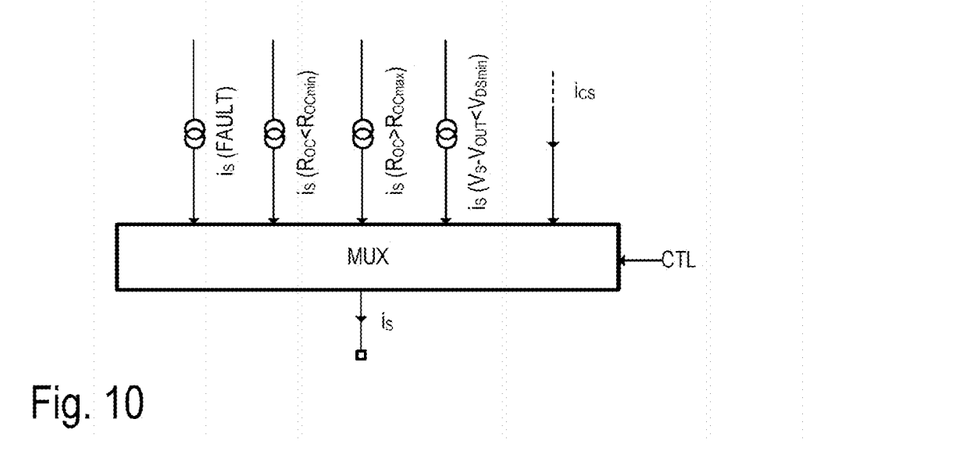
FIG. 10 illustrates an example of a possible diagnosis output circuit which can be used in the intelligent semiconductor switch from FIG. 2.

FIG. 10 illustrates an example of a possible implementation of the diagnosis output circuit 14 from FIG. 2. In the example illustrated, the diagnosis output circuit 14 comprises a multiplexer MUX and a plurality of current sources that provide the current levels $i_s$ (FAULT), $i_s$ ($R_{OC}$<$R_{OCmin}$), is ($R_{OC}$>$R_{OCmax}$) and is ($V_S$-$V_{OUT}$<$V_{DSmin}$) illustrated in FIG. 5. In addition, the current $i_{CS}$ provided by the current measuring circuit CS can be fed (optionally via one or more current mirrors) to an input of the multiplexer MUX. The driver logic 10 (see FIG. 2) is configured to output no current or a specific current at the diagnosis pin IS depending on the state of the intelligent semiconductor switch. In the present example, the selection signal CTL fed to the multiplexer is generated by the driver logic 10 and can be dependent—inter alia—on the input signals $V_{IN}$ and $V_{DEN}$ and also on the logic signals HI and LO (see FIG. 7).

It goes without saying that the examples illustrated in the figures are merely exemplary implementations of the functions described. A person skilled in the art is readily able to provide other implementations which fulfil substantially the same function. By way of example, the parameter readout circuit 13 (cf. FIG. 2 and FIG. 7) can also digitally detect the component parameter sought. For this purpose, e.g. a digital-to-analog converter with a current output could be coupled to the configuration pin OC such that the output current of the digital-to-analog converter flows through the external resistor $R_{OC}$. The digital-to-analog converter can then be controlled digitally such that the voltage at the configuration pin OC assumes the desired value $V_{REF}$. The input register of the digital-to-analog converter then contains a digital value representing the current through the resistor $R_{OC}$ and thus also the resistance value. The diagnosis output circuit 14, too, can alternatively be implemented by means of a digital-to-analog converter with a current output, wherein the logic circuit 10 digitally defines the current $i_s$ to be output. As mentioned, many different possibilities of current measurement are also known (cf. FIG. 2, current measuring circuit CS).

What is claimed is:

1. A circuit comprising the following:
a supply pin and an output pin for connecting a load, and a configuration pin;
a semiconductor switch connected between the supply pin and the output pin and configured to establish or to block a current path between the supply pin and the output pin depending on a control signal; and
a control circuit configured to
generate the control signal for the semiconductor switch taking account of a first parameter, and
set the first parameter depending on a component parameter of an external component connected to the configuration pin, wherein the first parameter is set to a first standard value when the component parameter is less than a first threshold value, the first parameter is set to a second standard value when the component parameter is greater than a second threshold value, and the first parameter is set to a continuously variable value based on the component parameter when the component parameter is between the first threshold value and the second threshold value.

2. The circuit as claimed in claim 1, wherein the first parameter is a maximum output current, and wherein the component parameter is a resistance value of an external resistor connected to the configuration pin.

3. The circuit as claimed in claim 2, wherein the control circuit comprises a current limiting circuit coupled to the semiconductor switch and configured to limit a load current of the semiconductor switch to the maximum output current.

4. The circuit as claimed in claim 1, wherein the control circuit further comprises a parameter readout circuit configured to:
detect a digital value representing the component parameter, or
detect a current representing the component parameter.

5. The circuit as claimed in claim 1, wherein the first parameter is an over-temperature threshold value, a differential temperature, a threshold value for an overcurrent turn-off or a threshold value for an estimated cable temperature of a cable connected to the output pin.

6. A circuit comprising the following:
a supply pin and an output pin for connecting a load, and a configuration pin;
a semiconductor switch connected between the supply pin and the output pin and configured to establish or to block a current path between the supply pin and the output pin depending on a control signal;
a control circuit configured to
generate the control signal for the semiconductor switch taking account of a first parameter, and
set the first parameter depending on a component parameter of an external component connected to the configuration pin, wherein the first parameter is set to a first standard value when the component parameter is less than a first threshold value, the first parameter is set to a second standard value when the component parameter is greater than a second threshold value; and
a diagnosis pin, wherein the control circuit is further configured to output a diagnosis signal indicating, depending on a diagnosis request signal, whether the component parameter is less than the first threshold value or greater than the second threshold value.

7. The circuit as claimed in claim 6, further comprising a first input pin for receiving an input signal, wherein the control circuit is further configured to generate the control signal for the semiconductor switch depending on the input signal such that the semiconductor switch is switched on or off according to the input signal.

8. The circuit as claimed in claim 7, wherein
the diagnosis signal is a diagnosis current; and
a current value of the diagnosis current indicates whether the component parameter is less than the first threshold value or greater than the second threshold value when the input signal indicates switching off of the semiconductor switch.

9. The circuit as claimed in claim 7, wherein
the diagnosis signal is a diagnosis current; and
a current value of the diagnosis current represents a load current of the semiconductor switch when the input signal indicates switching on of the semiconductor switch.

10. The circuit as claimed in claim 7, wherein the diagnosis signal is dependent on the input signal.

11. A method comprising:
setting a first parameter based on a component parameter of an external component connected to a configuration pin, wherein the first parameter is set to a first standard value when the component parameter is less than a first threshold value, the first parameter is set to a second standard value when the component parameter is greater than a second threshold value, and the first parameter is set to a continuously variable value based on the component parameter when the component parameter is between the first threshold value and the second threshold value; and generating a control signal for a semiconductor switch taking account of the first parameter.

12. The method as claimed in claim 11, wherein the first parameter represents a maximum load current of the semiconductor switch, and the component parameter is a resistance value of a resistor connected to the configuration pin.

13. The method as claimed in claim 12, further comprising feeding a current into the resistor to cause a voltage across the resistor to assume a target value, wherein the first parameter is determined by the current fed into the resistor when the current fed into the resistor is within a predefined range.

14. The method as claimed in claim 13, wherein:
the first parameter corresponds to the first standard value when the current fed into the resistor is below the predefined range, and corresponds to the second standard value when the current fed into the resistor is above the predefined range.

15. The method as claimed in claim 11, further comprising:
detecting whether the component parameter is less than the first threshold value or greater than the second threshold value, and
outputting a diagnosis signal indicating, depending on a diagnosis request signal, whether the component parameter is less than the first threshold value or greater than the second threshold value.

16. An integrated circuit comprising:
a switch driver circuit configured to be coupled to a semiconductor switch;
a current measurement circuit configured to be coupled to the semiconductor switch;
a resistance sensing circuit configured to be coupled to an external resistor via an external interface pin; and
a current limiting circuit coupled to the switch driver circuit, the current measurement circuit, and the resistance sensing circuit, the current limiting circuit configured to limit a current though the semiconductor switch to a first current level when a resistance sensed by the resistance sensing circuit is less than a first threshold value, to limit the current through the semiconductor switch to a second current level when the resistance sensed by the resistance sensing circuit is greater than a second threshold value, and to limit the current through the semiconductor switch to a continuously variable current level based on the resistance sensed by the resistance sensing circuit when the resistance sensed by the resistance sensing circuit is between the first threshold value and the second threshold value.

17. The integrated circuit of claim 16, wherein the resistance sensing circuit comprises:
a current sensing circuit;
a first transistor having a load path coupled between the current sensing circuit and the external interface pin; and
an amplifier having an output coupled to a control node of the first transistor, a first input coupled to the external interface pin, and a second input coupled to a reference voltage node.

18. The integrated circuit of claim 17, wherein the current sensing circuit comprises:
a current mirror having an input coupled to the load path of the first transistor;
a first current source having an output coupled to a first output of the current mirror, wherein a current provided by the first current source is based on the first threshold value; and
a second current source having an output coupled to a second output of the current mirror, wherein a current provided by the second current source is based on the first threshold value.

19. The integrated circuit of claim 16, further comprising the semiconductor switch.

20. The integrated circuit of claim 19, wherein the current measurement circuit comprises:
a current measurement transistor having a control node coupled to a control node of the semiconductor switch, and a first output node coupled to a first output node of the semiconductor switch; and
a resistor coupled to a second output node of the current measurement transistor.

* * * * *